(12) United States Patent
Gurr et al.

(10) Patent No.: US 10,845,435 B2
(45) Date of Patent: Nov. 24, 2020

(54) DEVICE FOR REGISTERING AN ON STATE OF A DRIVE MOTOR OR A TOOL, AND SYSTEM

(71) Applicant: Andreas Stihl AG & Co. KG, Waiblingen (DE)

(72) Inventors: Kay-Steffen Gurr, Heilbronn (DE); Andre Vaas, Jagstzell (DE); Rudolf Saemann, Balingen (DE); Marc Saemann, Balingen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 82 days.

(21) Appl. No.: 16/402,294

(22) Filed: May 3, 2019

(65) Prior Publication Data
US 2019/0339338 A1 Nov. 7, 2019

(30) Foreign Application Priority Data

May 4, 2018 (EP) .................................. 18170888

(51) Int. Cl.
| | | |
|---|---|---|
| *G01R 33/02* | (2006.01) | |
| *G01R 19/04* | (2006.01) | |
| *G07C 3/02* | (2006.01) | |
| *H04Q 9/00* | (2006.01) | |
| *B25F 5/02* | (2006.01) | |

(52) U.S. Cl.
CPC ................ *G01R 33/02* (2013.01); *B25F 5/02* (2013.01); *G01R 19/04* (2013.01); *G07C 3/02* (2013.01); *H04Q 9/00* (2013.01); *H04Q 2209/40* (2013.01)

(58) Field of Classification Search
None
See application file for complete search history.

(56) References Cited

U.S. PATENT DOCUMENTS

| | | | |
|---|---|---|---|
| 2014/0240125 A1 | 8/2014 | Burch et al. | |
| 2015/0369687 A1* | 12/2015 | Furman | G01M 1/16 |
| | | | 73/457 |
| 2018/0068493 A1 | 3/2018 | Russ et al. | |

FOREIGN PATENT DOCUMENTS

| | | | |
|---|---|---|---|
| DE | 102 57 841 A1 | 6/2004 | |
| EP | 3 291 181 A1 | 3/2018 | |
| WO | WO 2013/134715 A2 | 9/2013 | |

OTHER PUBLICATIONS

European-language Search Report issued in counterpart European Application No. 18170888.4 dated Oct. 26, 2018 with partial English translation (eight (8) pages).

* cited by examiner

*Primary Examiner* — Carlos Garcia
(74) *Attorney, Agent, or Firm* — Crowell & Moring LLP

(57) ABSTRACT

A device registers an On state of a drive motor of a tool. A changing magnetic flux is produced in the On state of the drive motor. First and second peak hold detectors generate upper and lower peak signals from induced voltage output signals. An evaluation device is configured to form a difference from the generated upper peak signal and the generated lower peak signal, and compare the formed difference with an adjustable threshold value in order to determine the On state of the drive motor when the threshold value is reached or exceeded.

18 Claims, 6 Drawing Sheets

DEVICE FOR REGISTERING AN ON STATE OF A DRIVE MOTOR OR A TOOL, AND SYSTEM

CROSS REFERENCE TO RELATED APPLICATIONS

This application claims priority under 35 U.S.C. § 119 from European Patent Application No. 18170888.4, filed May 4, 2018, the entire disclosure of which is herein expressly incorporated by reference.

BACKGROUND AND SUMMARY OF THE INVENTION

The invention relates to a device for registering an On state of a drive motor of a tool and to a system having such a device and a tool having a drive motor and/or a terminal.

The invention is based on the object of providing a device for registering an On state of a drive motor of a tool, which device registers well and is energy-saving and flexible, and a system having such a device and a tool having a drive motor and/or a terminal.

The device according to the invention is designed for, in particular automatically, registering or detecting an On state, in particular a, in particular non-zero, speed, of a drive motor of a tool. The device is designed for arrangement on, in particular in, the tool. In the On state, in particular at the, in particular non-zero, speed, of the drive motor, a changing, in particular over time, magnetic flux is produced, in particular only in the On state. The device has an, in particular electrical, inductive sensor, a, in particular electrical, capacitor, an, in particular electrical, amplifier, a, in particular electrical, first peak hold detector, a, in particular electrical, second peak hold detector, an, in particular electrical, evaluation device and a, in particular electrical, communication interface. The inductive sensor is designed so that a, in particular electrical, voltage signal is induced in the inductive sensor, in particular automatically, on the basis of the changing magnetic flux. The capacitor is electrically connected to the inductive sensor. The amplifier is designed to amplify the induced voltage signal or a signal based on the voltage signal, in particular automatically, to produce an, in particular electrical, output voltage signal. The first peak hold detector is designed to generate an, in particular electrical, upper peak signal, in particular automatically, from the output voltage signal or a signal based on the output voltage signal. The second peak hold detector is designed to generate a, in particular electrical, lower peak signal, in particular automatically, from the output voltage signal or the signal based on the output voltage signal. The evaluation device is designed to form a difference from the generated upper peak signal and the generated lower peak signal, to compare the formed difference, in particular a value or an absolute value of the difference, or a quantity based on the formed difference, in particular a value or an absolute value of the quantity, with an adjustable, in particular a user-adjustable, threshold value, and to determine or ascertain the On state, in particular the speed, of the drive motor, in particular automatically, when the threshold value is reached or exceeded. The communication interface is designed to send or transmit, in particular automatically, the determined On state, in particular the speed, and/or operating data based on the On state wirelessly to a terminal.

The device or the capacitor thereof and the peak hold detectors thereof allow relatively good registration of the On state, in particular the speed, at a relatively low power consumption. In detail, the capacitor allows use of a frequency response in the direction of higher frequencies and hence allows the amplifier to be relatively slow and hence relatively energy-saving and inexpensive. The peak hold detectors allow both half-cycles of the output voltage signal and/or of the signal based on the output voltage signal to be able to be evaluated. In addition, the device or the evaluation device thereof or the adjustable threshold value thereof allows a relatively high level of flexibility, in particular customization to the tool or the drive motor thereof.

Additionally, the device can be designed for, in particular automatically, registering an Off state, in particular a zero speed, of the drive motor of the tool. In particular, a changing magnetic flux does not need or is not able to be produced in the Off state of the drive motor and a voltage signal does not need or is not able to be induced in the inductive sensor. Additionally or alternatively, the evaluation device can be designed to determine the Off state of the drive motor, in particular automatically, when the threshold value is not reached. As a further addition or alternative, the communication interface can be designed to send the determined Off state and/or operating data based on the Off state wirelessly to the terminal, in particular automatically.

The tool can have an electric drive motor or an internal combustion drive engine or can be driven by means of an electric motor or an internal combustion engine. In particular, the electric motor can be a universal motor, or a brushed DC motor, or a brushless DC motor, or a three-phase motor. Additionally or alternatively, the changing magnetic flux may have been or can be caused by a stray field of the electric drive motor, an ignition pulse of the internal combustion drive engine, changes of current, moving magnets in a flywheel of the tool, of a generator, etc. In this respect, reference should also be made to the relevant specialist literature.

The device can be designed for, in particular mechanical, coupling to or mounting or attachment on/to, in particular in, the tool. In particular, the device can be designed for, in particular detachable, connection to the tool, in particular by means of a material bond such as an adhesive bond, a force-fit connection such as a latching or snap-fit connection and/or a form-fit connection such as a screw joint. Additionally or alternatively, the device can be arranged on, in particular in, the tool, in particular can be part of the tool. Alternatively, the device can be designed to be separate from the tool. This allows the device to be retrofitted to the tool. In particular, the device can be referred to as a unit. As a further addition or alternative, the device, when arranged on the tool, can be in direct contact with the tool, in particular with a tool housing or a cover of the tool.

The inductive sensor can be designed so that, regardless of whether the tool can be driven by means of an electric drive motor or an internal combustion drive engine, the voltage signal can be induced in the inductive sensor on the basis of the changing magnetic flux. Therefore, the On state, in particular the, in particular non-zero, speed, for a large number of drive technologies such as wired, storage-battery-based, internal-combustion-engine-driven can be registered using the same device, in particular without a wired connection to the tool or to components of the tool needing to be required. Additionally or alternatively, the inductive sensor can be designed to wirelessly register or detect the changing magnetic flux, in particular without having a direct electrical connection to the tool or components of the tool. As a further addition or alternative, the inductive sensor can have or be a, in particular electrical, coil, in particular in the form of a wired-up coil, an inductance on a chip and/or an SMD coil. As a further addition or alternative, the voltage signal can be referred to as a self-inductive voltage signal. In this respect, reference should also be made to the relevant specialist literature.

The inductive sensor and the capacitor can be connected in series, in particular in relation to an input of the amplifier. In particular, the capacitor, the inductive sensor and the input, in particular in that order, can be connected in series.

The amplifier can be electrically connected to the inductive sensor and/or the capacitor. Additionally or alternatively, the amplifier can have or be an operational amplifier. In this respect, reference should also be made to the relevant specialist literature.

The first peak hold detector and/or the second peak hold detector can, in particular each, be electrically connected to the amplifier. Additionally or alternatively, the first peak hold detector and the second peak hold detector can be different and/or of the same design. As a further addition or alternative, the upper peak signal and the lower peak signal can be different. In this respect, reference should also be made to the relevant specialist literature.

The evaluation device can be electrically connected to the first peak hold detector and/or the second peak hold detector. Additionally or alternatively, the difference formation can be software-based. As a further addition or alternative, the threshold value can be adjustable in at least three, in particular in at least five, in particular in at least ten, in particular in at least twenty, in particular in at least fifty, in particular in at least one hundred, different steps or continuously. As a further addition or alternative, the threshold value can be software-based. As a further addition or alternative, the evaluation device can be designed so as, when the threshold value is reached or exceeded, to determine that the state of the drive motor can be or is On, in particular to determine a value or an absolute value of the, in particular non-zero, speed, and/or so as, when the threshold value is not reached, to determine that the state of the drive motor can be or is Off. As a further addition or alternative, the evaluation device can be designed to determine or ascertain the operating data, in particular in the form of operating hours or an operating period, in particular during which the drive motor can be On or active. As a further addition or alternative, the evaluation device can have or be a microcontroller. In this respect, reference should also be made to the relevant specialist literature.

Additionally, the device can have an, in particular electrical, operating data memory. The operating data memory can be designed to store, in particular automatically, the determined On state, in particular the, in particular non-zero, speed, and/or operating data based on the On state. In particular, the operating data memory can be electrically connected to the evaluation device. Additionally or alternatively, the operating data memory can have or be a volatile memory such as a RAM (Random Access Memory) and/or a non-volatile memory such as an EEPROM memory. In this respect, reference should also be made to the relevant specialist literature.

The communication interface can be electrically connected to the evaluation device and/or the operating data memory, if present. In particular, the communication interface can be designed to send the stored On state, in particular the, in particular non-zero, speed, and/or stored operating data wirelessly to the terminal, in particular automatically. Additionally or alternatively, the communication interface can have or be a WLAN interface and/or a Bluetooth interface. As a further addition or alternative, the communication interface can be designed to send regardless of whether or not a terminal is in range. A fixed or variable time interval can be used for sending. In this respect, reference should also be made to the relevant specialist literature.

The device can be referred to as an electrical device. Additionally or alternatively, the device described above with all or some of its properties can be intended to be able to be used with the tool for registering the On state, in particular the, in particular non-zero, speed, of the drive motor of the tool. In other words: use of the device for registering the On state, in particular the, in particular non-zero, speed, of the drive motor of the tool.

The terminal can for example take the received On state, in particular the, in particular non-zero, speed, and/or the received operating data as a basis for performing evaluations and can present said evaluations in visually conditioned form to a user, for example.

In one development of the invention, the drive motor is an internal combustion drive engine. The changing magnetic flux has been or is caused by an ignition pulse of the internal combustion drive engine. The device or the capacitor thereof allows registration of the ignition pulse. In particular, the ignition pulse can be relatively short and/or relatively steep over time. Additionally or alternatively, the ignition pulse may have been or can be caused by a spark plug or a spark-plug wire.

In one development of the invention, the inductive sensor and the capacitor form at least part of a, in particular electrical, resonant circuit, in particular the whole of a, in particular electrical, resonant circuit. This allows a magnetic flux changing relatively quickly over time, in particular the ignition pulse that is relatively short and/or relatively steep over time, to result in the induced voltage signal or the signal based on the voltage signal, or an input signal on the amplifier, being able to be or being attenuated in artificially slowed-down or slower fashion by developing oscillations or vibrations. Therefore, the output voltage signal can spend more time above threshold values of the peak hold detectors for charging and discharging sample capacitors of the peak hold detectors. Therefore, the difference can be relatively large. Therefore, the magnetic flux changing relatively quickly over time, in particular the ignition pulse, can be registered or detected, which, according to a gain/bandwidth product of the amplifier, ought not to be measurable at all without a capacitor or resonant circuit. In particular, the amplifier can be electrically connected to the resonant circuit.

In one development of the invention, the inductive sensor has an, in particular electrical, inductance of no less than 10 microhenries (µH) and/or of no more than 1000 millihenries (mH), in particular of 15 mH. Additionally or alternatively, the capacitor has an electrical capacitance of no less than 1 picofarad (pF) and/or of no more than 1 microfarad (µF). Additionally or alternatively, the electrical resonant circuit, if present, has a resonant frequency of no less than 50 hertz (Hz) and/or of no more than 5 megahertz (MHz). Additionally or alternatively, the amplifier has a gain/bandwidth product of no less than 100 kilohertz (kHz) and/or of no more than 5 megahertz (MHz). In particular, the resonant frequency can be dependent on the inductance and the capacitance.

In one development of the invention, the device has an electrical energy store, in particular a battery. The electrical energy store is designed to supply the inductive sensor, the capacitor, the amplifier, the first peak hold detector, the second peak hold detector, the evaluation device and/or the communication interface with electric power or voltage, in particular automatically. The electrical energy store allows the device to be without an external power supply. In particular, the battery can be a button cell, in particular a CR 2032 button cell or CR 2450 button cell, and/or a lithium-ion battery.

In one development of the invention, the device has at least one electrical resistor. The at least one electrical resistor is electrically connected to the inductive sensor and/or to an, in particular the, input of the amplifier such that, when a changing magnetic flux is not registered, or no changing magnetic flux is registered by the inductive sensor, or at rest, the input is at a higher voltage level than 0 (zero) volt (V), in particular when supplied with electric power or voltage, in particular automatically. In other words: the electrical resistor can be designed to generate or produce a voltage offset for the inductive sensor or for the voltage signal thereof. This allows both a positive half-cycle and a negative half-cycle of the induced voltage signal or of the signal based on the voltage signal to be used. Therefore, the output voltage signal can have both a positive half-cycle and a negative half-cycle, or the half-cycles. In particular, the at least one electrical resistor and the inductive sensor can be connected in series. Additionally or alternatively, the device can have two electrical resistors. As a further addition or alternative, the 0 V can be referred to as reference-ground voltage or ground.

In one refinement of the invention, the capacitor is electrically connected to the inductive sensor and/or to the input of the amplifier such that the capacitor assists the input to a positive voltage, in particular when supplied with electric power or voltage, in particular automatically, when the changing magnetic flux is registered by the inductive sensor. This allows the amplifier to have a relatively short recovery time and hence to have a relatively good reaction capacity, or high level of performance, at high frequencies.

In one development of the invention, the evaluation device has an, in particular electrical, analogue-to-digital convertor. The analogue-to-digital convertor is designed to form, in particular digitize, in particular automatically, the difference from the upper peak signal and the lower peak signal. In particular, the upper peak signal and/or the lower peak signal can, in particular each, be analogue. Additionally or alternatively, the difference can be digital. As a further addition or alternative, the analogue-to-digital convertor can be electrically connected to the first peak hold detector and/or to the second peak hold detector.

In one development of the invention, the communication interface is designed to receive a setting for the threshold value wirelessly, in particular from a, in particular the, terminal, in particular automatically. This allows relatively simple and hence user-friendly adjustment of the threshold value. In particular, the communication interface can be designed to send the difference and/or a signal based on the difference wirelessly to a, in particular the, terminal. The terminal can be designed to take the received difference as a basis for determining, or ascertaining, the setting of the threshold value and to send the determined setting of the threshold value. Additionally or alternatively, the communication interface can be designed to forward the received setting of the threshold value to the evaluation device, in particular such that the evaluation device can adopt the setting of the threshold value as a, in particular new, threshold value. As a further addition or alternative, the communication interface can be referred to as a bidirectional communication interface.

In one development of the invention, the device is designed to supply the inductive sensor, the capacitor, the amplifier, the first peak hold detector and/or the second peak hold detector with electric power or voltage, in particular from the electrical energy store, if present, or to activate it/them, periodically or cyclically during a wake period and not to supply it/them with electric power, or to deactivate it/them, in particular automatically, during a sleep period. This allows a relatively low power consumption and hence a relatively long operating time for the electrical energy store, if present. In particular, the device can be designed to supply the evaluation device and/or the communication interface with electric power, or to activate it/them, in particular periodically, not during the wake period but rather at a subsequent time. In particular, the evaluation device can then analyse the upper peak signal, which can be or is held by the first peak hold detector, and the lower peak signal, which can be or is held by the second peak hold detector, or can evaluate said peak signals, in particular form the difference, compare them and determine the state, in particular the speed. The device can be designed not to supply the evaluation device and/or the communication interface with electric power, or to deactivate it/them, at a subsequent time.

In one refinement of the invention, the wake period is no less than 10 milliseconds (ms), in particular no less than 30 ms, and/or no more than 1000 ms, in particular no more than 100 ms, in particular 40 ms. Additionally or alternatively, the sleep period is no less than 500 ms, in particular no less than 900 ms, and/or no more than 600 seconds (s), in particular no more than 2 s, in particular 960 ms. The wake period dimensioned in this manner allows at least one ignition pulse to be registered, or detected.

In one development of the invention, the device, in particular the evaluation device thereof, is designed to reset the first peak hold detector and the second peak hold detector, in particular to an initial state, in particular at a time after the formation of the difference, in particular automatically. This allows the On state or the Off state, in particular the speed, of the drive motor of the tool to be registered afresh, or repeatedly, or periodically.

The system according to the invention has a device as described above and a tool. The tool has a drive motor. In particular, the tool and/or the drive motor thereof can be designed in part or wholly as described above.

In one development of the invention, the tool is a manually guided, in particular handheld or soil-guided, tool. In particular manually guided, in particular handheld, tool can mean that the tool can have a mass of no more than 50 kilograms (kg), in particular of no more than 20 kg, in particular of no more than 10 kg. Additionally or alternatively, the tool can be a garden and/or forestry tool or a soil cultivation tool.

In particular, the tool can be a saw, or a high-level delimber or a pole pruner, respectively, or a hedge trimmer, or a hedge cutter, or a leaf blower, or a leaf suction device, or a sweeping roller, or a sweeping brush, or a lawn mower, or a brushcutter, or a scarifier, or an angle grinder, or a rotovator, or a pressure washer, or a sprayer, or a drill.

In addition or as an alternative to the tool, the system according to the invention can have a terminal. In particular, the terminal can be designed in part or wholly as described above. Additionally or alternatively, the terminal can be any data-processing device, which can have a suitable wireless interface that can be designed for wireless communication with the communication interface of the device for registering the On state, in particular the, in particular non-zero, speed, of the drive motor. As a further addition or alternative, the terminal can form, or be, a gateway that can forward the received On state, in particular the, in particular non-zero, speed, or the received operating data to a server, such as to what is known as a cloud memory, that can store the On state, in particular the, in particular non-zero, speed, or the operating data. The On state, in particular the, in particular non-zero, speed, or operating data that is/are stored in the cloud memory can then be viewed and evaluated by means of a suitable tool such as a web browser. As a further addition or alternative, the terminal can be a mobile terminal such as a laptop, a tablet or a smartphone. In particular mobile can be referred to as portable or manually guided, in particular handheld.

Other objects, advantages and novel features of the present invention will become apparent from the following detailed description of one or more preferred embodiments when considered in conjunction with the accompanying drawings.

DETAILED DESCRIPTION OF THE DRAWINGS

FIGS. 1, 2 and 5 to 7 show a system 50 according to an embodiment of the invention. The system 50 has a device 1, a tool 4 and a terminal 12.

Figure 1:
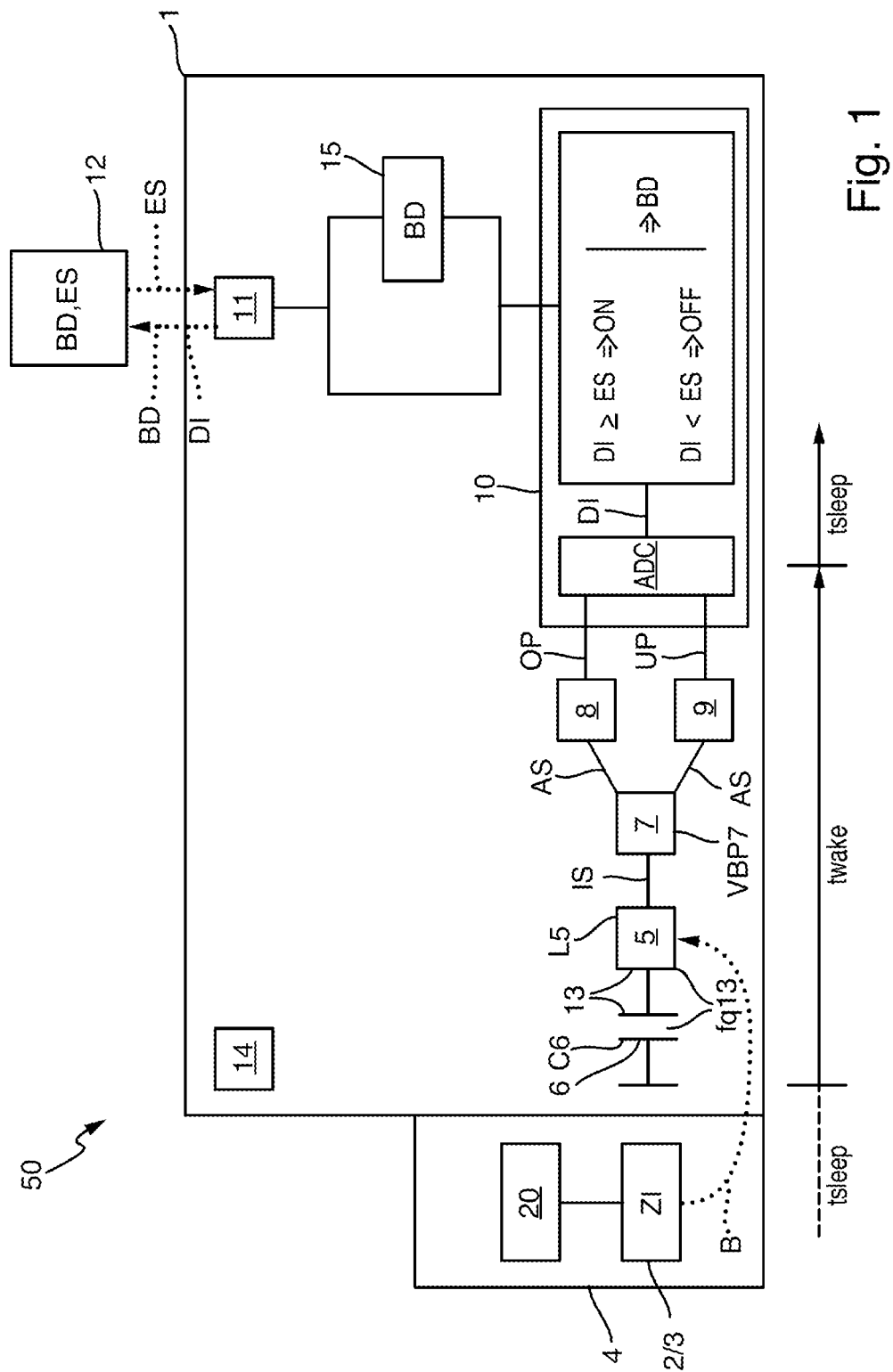
FIG. 1 shows a schematic block diagram of a system according to an embodiment of the invention with a device according to an embodiment of the invention for registering an On state of a drive motor of a tool, the tool and a terminal.
Figure 2:
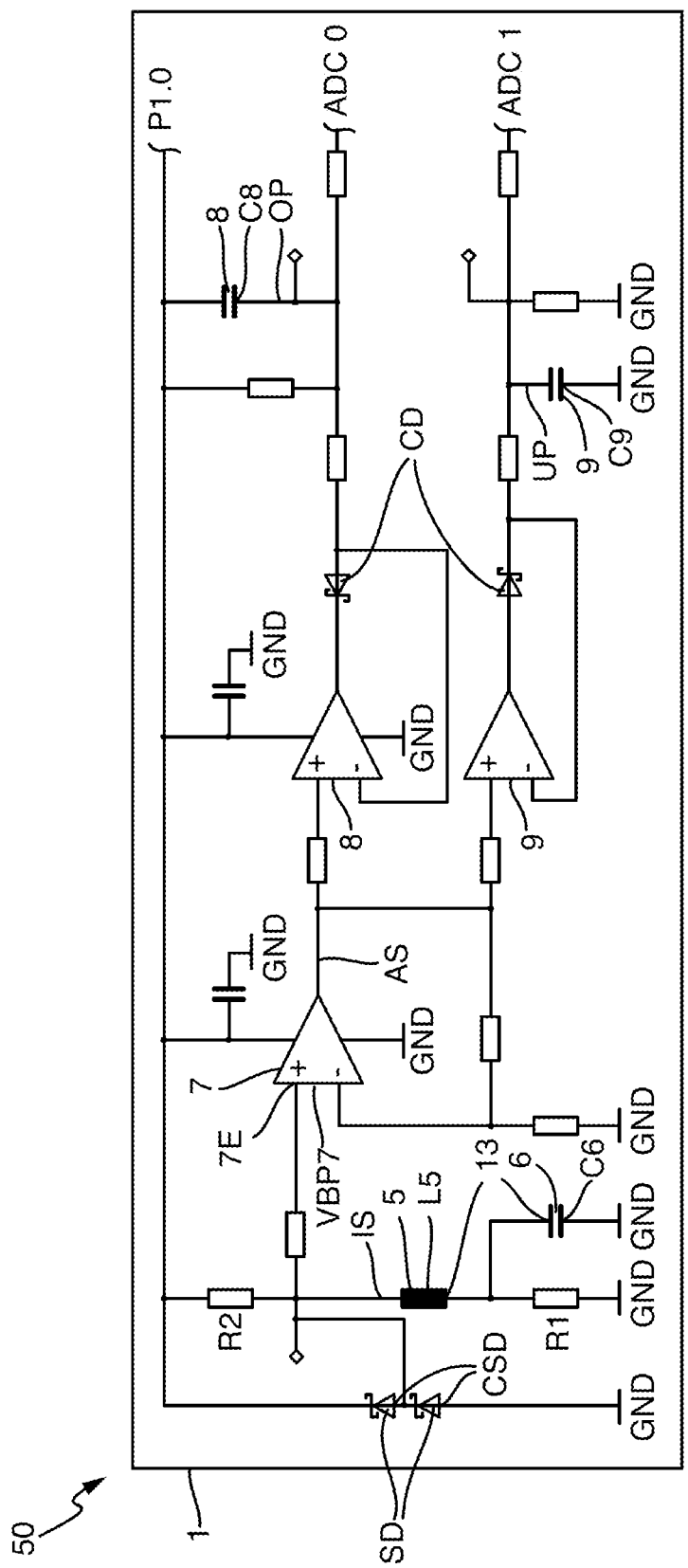
FIG. 2 shows a detailed block diagram of a detail of the device of FIG. 1.

In detail, the tool 4 has a drive motor 2, 3, in particular an electric drive motor 3 or an internal combustion drive engine 2, as shown in FIG. 1.

In addition, the tool 4 is a manually guided tool. In the exemplary embodiment shown, the manually guided tool 4 is a handheld tool. In alternative exemplary embodiments, the manually guided tool can be a soil-guided tool.

Figure 7:
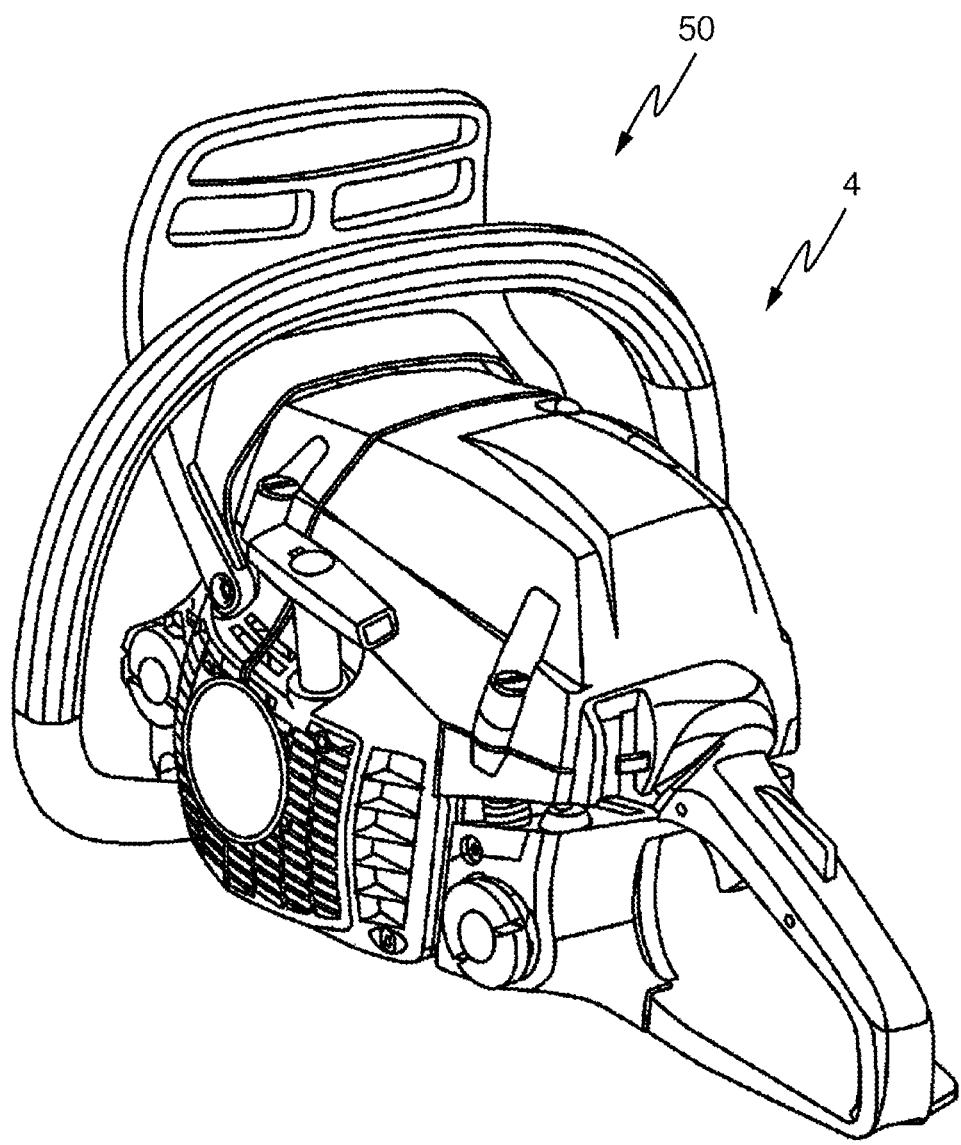
FIG. 7 shows a schematic perspective view of a detail of the tool of FIG. 1.

In detail, the tool 4 is a saw, as shown in FIG. 7. The saw 4 has a saw chain 20, wherein in particular the electric drive motor 3 or the internal combustion drive engine 2 is designed to drive the saw chain 20. In alternative exemplary embodiments, the tool can be a high-level delimber or a pole pruner, respectively, or a hedge trimmer, or a hedge cutter, or a leaf blower, or a leaf suction device, or a sweeping roller, or a sweeping brush, or a lawn mower, or a brushcutter, or a scarifier, or an angle grinder, or a rotovator, or a pressure washer, or a sprayer, or a drill.

The device 1 according to the invention is designed to register an On state On of the drive motor 2, 3 of the tool 4. In addition, the device 1 is designed for arrangement on the tool 4 or, in the exemplary embodiment shown, is arranged on the tool 4. In the On state On of the drive motor 2, 3, a changing magnetic flux B is produced. Additionally, the device 1 has an inductive sensor 5, a capacitor 6, an amplifier 7, a first peak hold detector 8, a second peak hold detector 9, an evaluation device 10 and a communication interface 11, as shown in FIGS. 1, 2, 5 and 6. The inductive sensor 5 in the form of a coil is designed so that a voltage signal IS is induced in the inductive sensor 5 on the basis of the changing magnetic flux B. The capacitor 6 is electrically connected to the inductive sensor 5. In the exemplary embodiment shown, the amplifier 7 in the form of an operational amplifier is designed to amplify the induced voltage signal IS to produce an output voltage signal AS. In alternative exemplary embodiments, the amplifier can be designed to amplify a signal based on the voltage signal to produce an output voltage signal. In the exemplary embodiment shown, the first peak hold detector 8 is designed to generate an upper peak signal OP from the output voltage signal AS. In alternative exemplary embodiments, the first peak hold detector can be designed to generate an upper peak signal from a signal based on the output voltage signal. In the exemplary embodiment shown, the second peak hold detector 9 is designed to generate a lower peak signal UP from the output voltage signal AS. In alternative exemplary embodiments, the second peak hold detector can be designed to generate a lower peak signal from the signal based on the output voltage signal. The evaluation device 10 is designed to form a difference DI from the generated upper peak signal OP and the generated lower peak signal UP. In addition, in the exemplary embodiment shown, the evaluation device 10 in the form of a microcontroller is designed to compare the formed difference DI with an adjustable threshold value ES. In alternative exemplary embodiments, the evaluation device can be designed to compare a quantity based on the formed difference with an adjustable threshold value. Additionally, the evaluation device 10 is designed to determine the On state On of the drive motor 2, 3 when the threshold value ES is reached or exceeded. In the exemplary embodiment shown, the communication interface 11 is designed to send operating data BD based on the On state On wirelessly to a terminal 12. In alternative exemplary embodiments, the communication interface can be designed to send the determined On state wirelessly to the terminal.

Additionally, the device 1 is designed to register an Off state Off of the drive motor 2, 3 of the tool 4. In detail, in the Off state Off of the drive motor 2, 3, no changing magnetic flux is produced and no voltage signal is induced in the inductive sensor 5. The evaluation device 10 is designed to determine the Off state Off of the drive motor 2, 3 when the threshold value ES is not reached. The communication interface 11 is designed to send the operating data BD based on the Off state Off wirelessly to the terminal 12.

In particular, registering the changing magnetic flux requires a direction of flow in relation to the inductive sensor 5 to be taken into consideration. The inductive sensor 5 can have multiple individual coil elements that can be oriented differently in relation to one another. Further, a defined positioning of the inductive sensor 5 on the tool 4 or a defined orientation of the inductive sensor 5 in relation to the tool 4 can be chosen.

In detail, the changing magnetic flux B is caused by an ignition pulse ZI of the internal combustion drive engine 2.

Further, the inductive sensor 5 and the capacitor 6 form at least part of a resonant circuit 13.

In detail, the device 1 has protective diodes SD having parasitic capacitances CSD. The inductive sensor 5, the capacitor 6 and the protective diodes SD form the whole of the resonant circuit 13.

In the exemplary embodiment shown, the inductive sensor 5 has an inductance L5 of 15 mH. In alternative exemplary embodiments, the inductive sensor can have an inductance of no less than 10 µH and/or of no more than 1000 mH.

In addition, in the exemplary embodiment shown, the capacitor 6 has an electrical capacitance C6 of no less than 1 pF and/or of no more than 1 µF.

Additionally, in the exemplary embodiment shown, the electrical resonant circuit 13 has a resonant frequency fq13 of no less than 50 Hz and/or of no more than 5 MHz.

Further, in the exemplary embodiment shown the amplifier 7 has a gain/bandwidth product VBP7 of no less than 100 kHz and/or of no more than 5 MHz.

Figure 3:
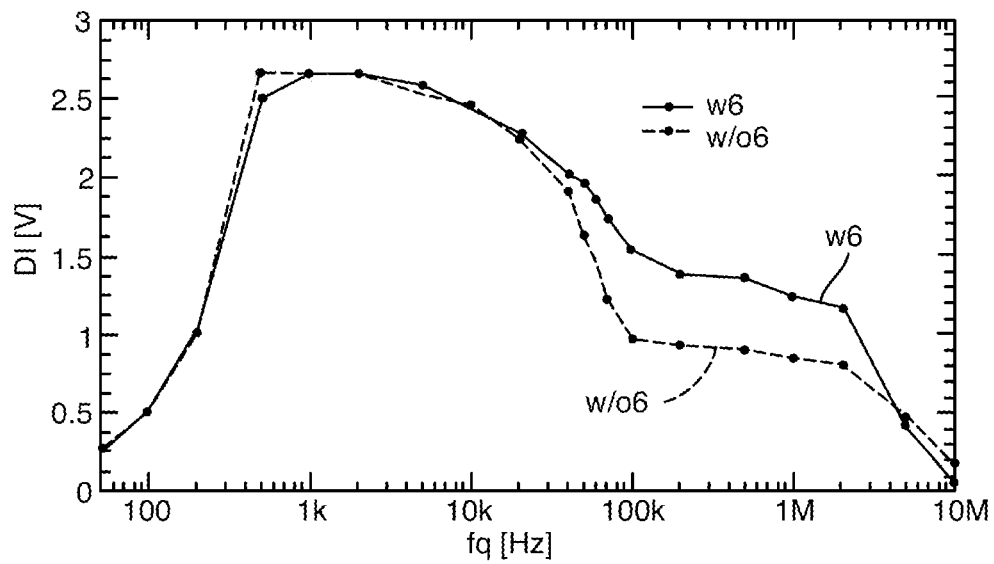
FIG. 3 shows a graph of a difference for the device of FIG. 1 with a capacitor and without a capacitor over a frequency of a changing magnetic flux.

The capacitor 6 tunes the resonant circuit 13 and therefore improves the difference DI at high frequencies fq of upward of 100 kHz significantly, as shown in FIG. 3 for an excitation of the device 1 with a single pulse for different frequencies fq with and without a capacitor 6.

In detail, the resonant circuit 13 or the capacitor 6 allows a magnetic flux B changing relatively quickly over time, in particular the ignition pulse ZI that is relatively short and/or relatively steep over time, to result in the induced voltage signal IS on the amplifier 7 being attenuated in artificially slowed-down or slower fashion by developing oscillations. Therefore, the output voltage signal AS spends more time above threshold values of the peak hold detectors 8, 9 for charging and discharging sample capacitors C8, C9 of the peak hold detectors 8, 9. Therefore, the difference DI is relatively great.

In addition, in the exemplary embodiment shown, the amplifier 7 amplifies the induced voltage signal IS by a factor of 100.

Additionally, the device 1 has an electrical energy store 14, in particular a battery in the form of a button cell. The electrical energy store 14 is designed to supply the inductive sensor 5, the capacitor 6, the amplifier 7, the first peak hold detector 8, the second peak hold detector 9, the evaluation device 10 and/or the communication interface 11 with electric power, in particular with a voltage of for example 3 V.

As a further addition, the device 1 has at least one electrical resistor R1, R2. The at least one electrical resistor R1, R2 is electrically connected to the inductive sensor 5 and an input 7E of the amplifier 7 such that the input 7E is at a higher voltage level than 0 V, for example at 1.5 V, in particular when supplied with electric power or voltage, when a changing magnetic flux is not registered by the inductive sensor 5.

In the exemplary embodiment shown, the device has a first electrical resistor R1, and a second electrical resistor R2.

Also, the capacitor 6 is electrically connected to the inductive sensor 5 and the input 7E of the amplifier 7 such that the capacitor 6 assists the input 7E to a positive voltage, in particular when supplied with electric power or voltage, when the changing magnetic flux B is registered by the inductive sensor 5.

In detail, the device 1 has a reference voltage of 0 V or ground GND.

Ground GND, the capacitor 6, the inductive sensor 5 and the input 7E of the amplifier 7 are connected in series in that order.

In addition, the device 1 or the evaluation device 10 thereof has a pin or port P1.0. The device 1 or the evaluation device 10 thereof is designed to configure the pin P1.0 either as output or into an energy-saving state PS and/or to set it either to Low, or 0 V, or GND, or to High, or the voltage of the electrical energy store 14, for example 3 V.

Ground GND, the first electrical resistor R1, the inductive sensor 5, the second electrical resistor R2 and the pin P1.0 are connected in series in that order.

Therefore, the inductive sensor 5 can be at a higher voltage level than 0 V.

In detail, the capacitor 6 and the first electrical resistor R1 are connected in parallel between ground GND and the inductive sensor 5.

Additionally, the evaluation device has an analogue-to-digital convertor ADC. The analogue-to-digital convertor ADC is designed to form the difference DI from the upper peak signal OP and the lower peak signal UP.

In detail, the analogue-to-digital convertor ADC has a first pin, or a first port, ADC0. Further, the analogue-to-digital convertor ADC has a second pin, or a second port, ADC1. The device 1, or the evaluation device 10 thereof, or the analogue-to-digital convertor ADC thereof, is designed to configure the first pin ADC0 and/or the second pin ADC1, in particular in each case, either as an output or as an input or into an energy-saving state PS and/or to set it either to Low, or 0 V, or GND, or to High, or the voltage of the electrical energy store 14, for example 3 V. The first pin ADC0 is electrically connected to the first peak hold detector 8. The second pin ADC1 is electrically connected to the second peak hold detector 9.

Also, the first peak hold detector 8 is electrically connected to the amplifier 7 and the second peak hold detector 9 is electrically connected to the amplifier 7.

In detail, the first peak hold detector 8 has a first sample capacitor C8. The second peak hold detector 9 has a second sample capacitor C9.

In addition, the device 1 is designed to supply the inductive sensor 5, the capacitor 6, the amplifier 7, the first peak hold detector 8 and/or the second peak hold detector 9 with electric power or voltage, in particular from the electrical energy store 14, periodically during a wake period twake and not to supply it/them with electric power during a sleep period tsleep.

In the exemplary embodiment shown, the wake period twake is 40 ms. In alternative exemplary embodiments, the wake period can be no less than 10 ms and/or no more than 1000 ms.

Additionally, in the exemplary embodiment shown, the sleep period tsleep is 960 ms. In alternative exemplary embodiments, the sleep period can be no less than 500 ms and/or no more than 600 s.

Further, the device 1, or the evaluation device 10 thereof, or the analogue-to-digital convertor ADC thereof, is designed to reset the first peak hold detector 8 and the second peak hold detector 9, in particular to an initial state, in particular at a time after the formation of the difference DI.

Figure 4:
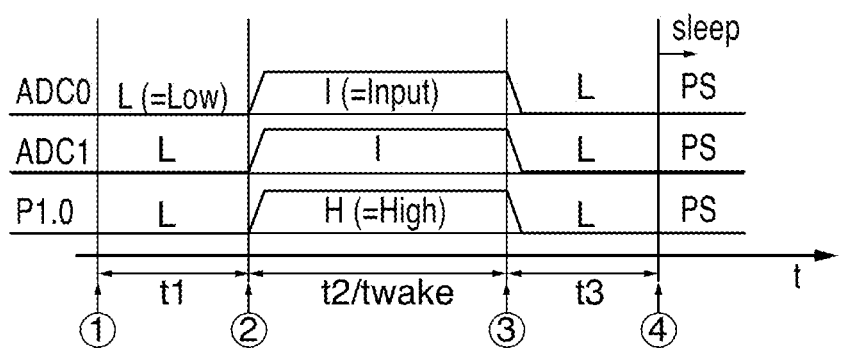
FIG. 4 shows a timing diagram for the registration by means of the device of FIG. 1.

In detail, registration involves firstly, or at first in time, the pin P1.0 being configured as an output and being set to Low, as shown in FIG. 4. The first pin ADC0 and the second pin ADC1 are, in particular each, configured as an output. The first pin ADC0 is set to Low. The second pin ADC1 is set to Low. Therefore, the first peak hold detector 8, or the first sample capacitor C8 thereof, and the second peak hold detector 9, or the second sample capacitor C9 thereof, are, in particular each, discharged.

Secondly, or at a subsequent time, the first pin ADC0 and the second pin ADC1 are, in particular each, configured as an input. Therefore, a registration time window is opened. The pin P1.0 is set to High, in particular for the wake period twake. Therefore, the inductive sensor 5, the capacitor 6, the amplifier 7, the first peak hold detector 8 and/or the second peak hold detector 9 are supplied with electric power.

Thirdly, or at a subsequent time, the analogue-to-digital convertor ADC forms the difference DI from the upper peak signal OP and the lower peak signal UP. The first pin ADC0 is configured as an output and set to Low. The pin P1.0 is set to Low. The second pin ADC1 is configured as an output and set to Low. Therefore, the first peak hold detector 8, or the first sample capacitor C8 thereof, and the second peak hold detector 9, or the second sample capacitor C9 thereof, are, in particular each, discharged. This allows a current via clamping diodes CD of the peak hold detectors 8, 9 to be prevented.

Fourthly, or at a subsequent time, the first pin ADC0 and the second pin ADC1 are, in particular each, configured into the energy saving state PS. The pin P1.0 is configured into the energy saving state PS. Therefore, the inductive sensor 5, the capacitor 6, the amplifier 7, the first peak hold detector 8 and/or the second peak hold detector 9 are not supplied with electric power.

Therefore, the device 1, or the evaluation device 10 thereof, or the analogue-to-digital convertor ADC thereof, resets the first peak hold detector 8 and the second peak hold detector 9.

When the threshold value ES is reached or exceeded by the difference DI, the evaluation device 10 determines that the state of the drive motor 2, 3 is On. When the threshold value ES is not reached by the difference, the evaluation device 10 determines that the state of the drive motor 2, 3 is Off.

In the exemplary embodiment shown, the evaluation device 10 is designed to determine the operating data BD, in particular in the form of operating hours, in particular during which the drive motor is On or active.

In addition, the communication interface 11 is electrically connected to the evaluation device 10.

Additionally, the communication interface 11 is designed to receive a setting for the threshold value ES wirelessly.

In detail, the communication interface 11 is designed to send the difference DI and/or a signal based on the difference wirelessly to the terminal 12. The terminal 12 is designed to take the received difference DI as a basis for determining the setting of the threshold value ES and to send the determined setting of the threshold value ES.

Further, the device 1 has an operating data memory 15. The operating data memory 15 is designed to store the operating data BD.

Figure 5:
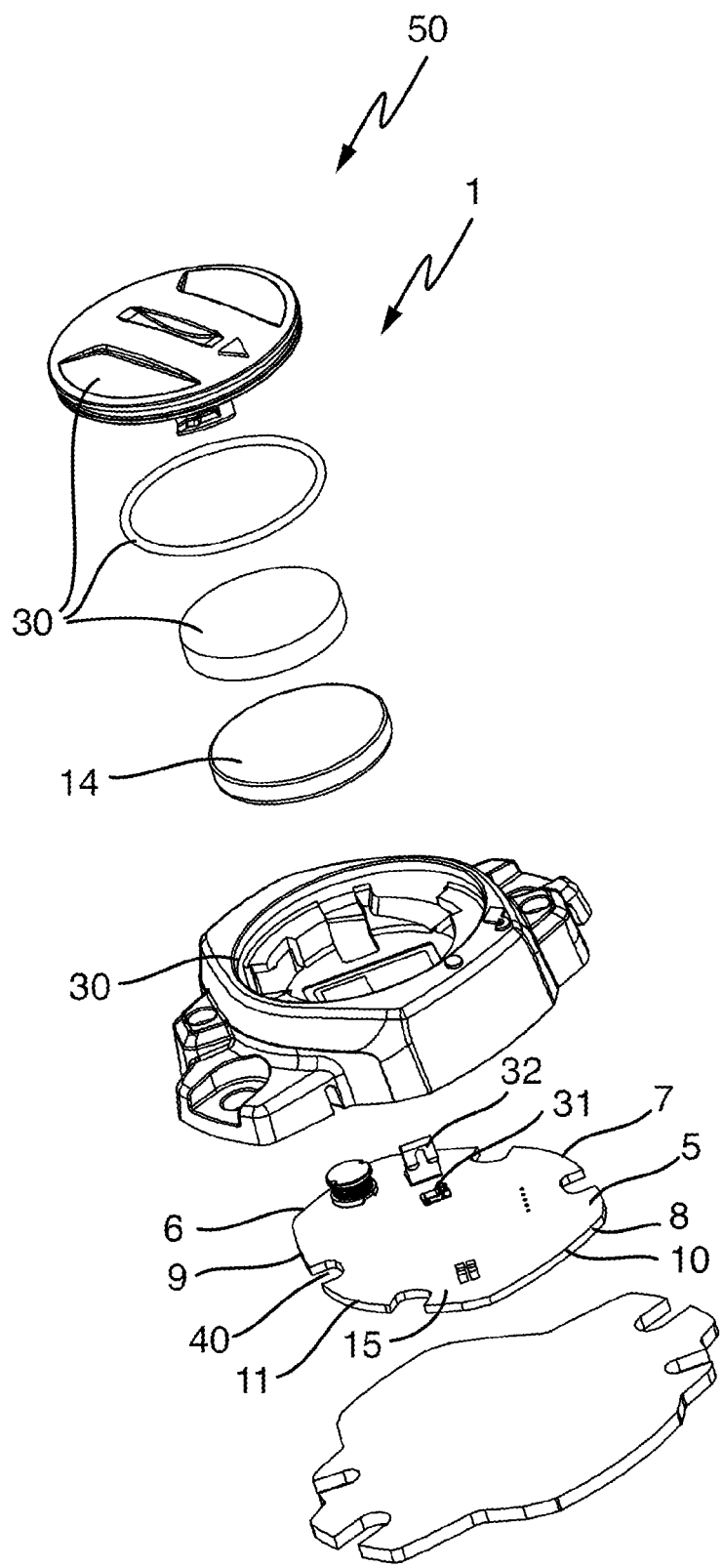
FIG. 5 shows a schematic exploded view of the device of FIG. 1.
Figure 6:
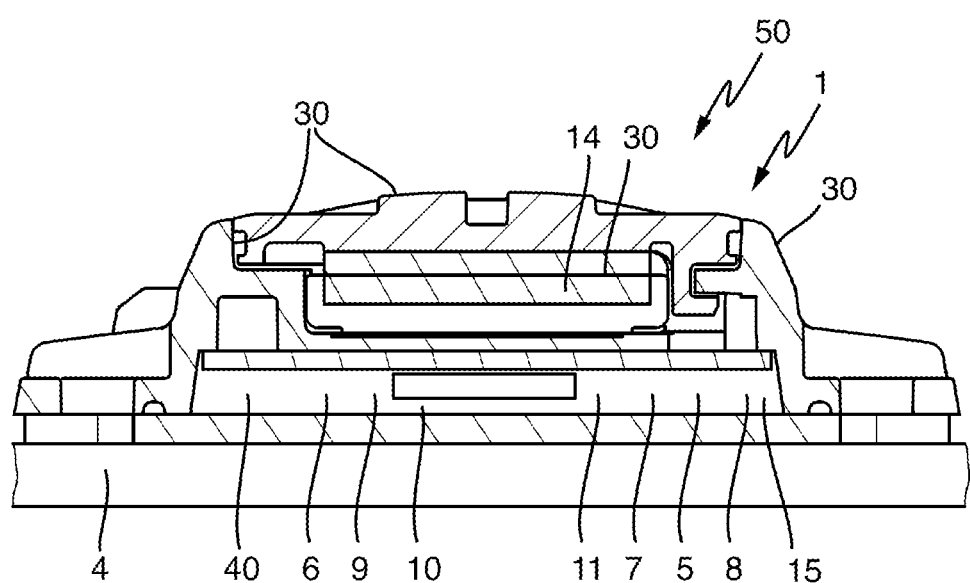
FIG. 6 shows a schematic longitudinal sectional view of the device of FIG. 1.

Also, the device 1 is designed to be separate from the tool 4, as shown in FIGS. 5 and 6.

In addition, the device 1 has a housing 30. The housing 30 is designed to accommodate the electrical energy store 14.

Additionally, the device 1 has resilient electrical contact elements 31, 32, in the exemplary embodiment shown two. The resilient electrical contact elements 31, 32 are designed to make electrical contact with corresponding electrical contacts of the accommodated electrical energy store 14.

Further, the contact elements 31, 32 are routed from the housing 30 to the outside, where they are electrically connected to corresponding connections, in particular on a circuit board 40 of the device 1.

In detail, the circuit board 40 is arranged on an underside of the housing 30. In particular, the circuit board 40 is mechanically connected to the housing 30.

In the exemplary embodiment shown, the circuit board 40 has the inductive sensor 5, the capacitor 6, the amplifier 7, the first peak hold detector 8, the second peak hold detector 9, the evaluation device 10, the communication interface 11 and the operating data memory 15.

As the exemplary embodiments shown, and explained above, make clear, the invention provides a device for registering an On state of a drive motor of a tool, which device registers well and is energy-saving and flexible, and a system having such a device and a tool having a drive motor and/or a terminal.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device for registering an On state of a drive motor of a tool, wherein the device is configured for arrangement on the tool, and wherein a changing magnetic flux is produced in the On state of the drive motor, the device comprising:
an inductive sensor, wherein the inductive sensor is configured so that a voltage signal is induced in the inductive sensor on the basis of the changing magnetic flux;
a capacitor, wherein the capacitor is electrically connected to the inductive sensor;
an amplifier, wherein the amplifier is configured to amplify the induced voltage signal or a signal based on the voltage signal to produce an output voltage signal;
a first peak hold detector and a second peak hold detector, wherein the first peak hold detector is configured to generate an upper peak signal from the output voltage signal or a signal based on the output voltage signal, and wherein the second peak hold detector is configured to generate a lower peak signal from the output voltage signal or the signal based on the output voltage signal;
an evaluation device, wherein the evaluation device is configured to form a difference from the generated upper peak signal and the generated lower peak signal, to compare the formed difference or a quantity based on the formed difference with an adjustable threshold value, and to determine the On state of the drive motor when the threshold value is reached or exceeded; and
a communication interface, wherein the communication interface is configured to send the determined On state and/or operating data based on the On state wirelessly to a terminal.

2. The device according to claim 1, wherein
the drive motor is an internal combustion drive engine and the changing magnetic flux is caused by an ignition pulse of the internal combustion drive engine.

3. The device according to claim 1, wherein
the evaluation device has an analogue-to-digital convertor, wherein the analogue-to-digital convertor is configured to form the difference from the upper peak signal and the lower peak signal.

4. The device according to claim 1, wherein
the communication interface is configured to receive wirelessly a setting for the threshold value.

5. The device according to claim 1, wherein
the device is configured to reset the first peak hold detector and the second peak hold detector.

6. The device according to claim 1, wherein
the inductive sensor and the capacitor form at least part of a resonant circuit.

7. The device according to claim 6, wherein one or more of:
the inductive sensor has an inductance of no less than 10 µH and/or of no more than 1000 mH,
the capacitor has an electrical capacitance of no less than 1 pF and/or of no more than 1 µF,
the electrical resonant circuit has a resonant frequency of no less than 50 Hz and/or of no more than 5 MHz, and
the amplifier has a gain/bandwidth product of no less than 100 kHz and/or of no more than 5 MHz.

8. The device according to claim 1, further comprising:
an electrical energy store, wherein the electrical energy store is configured to supply the inductive sensor, the capacitor, the amplifier, the first peak hold detector, the second peak hold detector, the evaluation device and/or the communication interface with electric power.

9. The device according to claim 8, wherein
the electrical energy store is a battery.

10. The device according to claim 1, further comprising:
at least one electrical resistor, wherein the at least one electrical resistor is electrically connected to the inductive sensor and/or to an input of the amplifier such that the input is at a higher voltage level than 0 V when a changing magnetic flux is not registered by the inductive sensor.

11. The device according to claim 10, wherein
the capacitor is electrically connected to the inductive sensor and/or to the input of the amplifier such that the capacitor assists the input to a positive voltage when the changing magnetic flux is registered by the inductive sensor.

12. The device according to claim 1, wherein
the device is configured to supply the inductive sensor, the capacitor, the amplifier, the first peak hold detector and/or the second peak hold detector with electric power periodically during a wake period and not to supply electric power during a sleep period.

13. The device according to claim 12, wherein
the wake period is no less than 10 ms and/or no more than 1000 ms, and/or
the sleep period is no less than 500 ms and/or no more than 600 s.

14. A system, comprising:
a device according to claim 1; and
a terminal.

15. The system according to claim 14, further comprising:
a tool, wherein the tool has a drive motor.

16. A system, comprising:
a device according to claim 1; and
a tool, wherein the tool has a drive motor.

17. The system according to claim 16, wherein
the tool is a manually guided tool.

18. The system according to claim 17, wherein
the tool is a handheld or soil-guided tool.

* * * * *